(12) United States Patent
Cameron et al.

(10) Patent No.: US 6,482,567 B1
(45) Date of Patent: Nov. 19, 2002

(54) OXIME SULFONATE AND N-OXYIMIDOSULFONATE PHOTOACID GENERATORS AND PHOTORESISTS COMPRISING SAME

(75) Inventors: James F. Cameron, Cambridge, MA (US); Gerhard Pohlers, Newton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/645,198

(22) Filed: Aug. 25, 2000

(51) Int. Cl.$^7$ ............... G03F 7/004; C07D 487/00; C07D 221/02; C09B 7/00; C07C 315/00
(52) U.S. Cl. ............ 430/270.1; 430/920; 430/921; 540/460; 540/461; 540/477; 548/420; 548/425; 548/452; 546/183; 568/30; 568/31; 568/34
(58) Field of Search ............... 430/325, 270.1, 430/920, 921, 924; 558/408; 540/477, 460, 492, 461, 533; 568/28, 31, 34, 30; 546/112, 183; 544/224; 548/420, 427, 425, 452

(56) References Cited

U.S. PATENT DOCUMENTS

| | | | | |
|---|---|---|---|---|
| 4,736,055 A | * | 4/1988 | Dietliker et al. ............... 560/13 |
| 6,077,644 A | * | 6/2000 | Hada et al. ............... 430/270.1 |
| 6,153,354 A | * | 11/2000 | Katsumata et al. ...... 430/270.1 |
| 6,261,738 B1 | * | 7/2001 | Asakura et al. .......... 430/270.1 |
| 6,265,130 B1 | * | 7/2001 | Lee et al. ................. 430/270.1 |
| 6,268,108 B1 | * | 7/2001 | Iguchi et al. ............. 430/271.1 |

FOREIGN PATENT DOCUMENTS

| | | | |
|---|---|---|---|
| JP | 8-179508 | * | 7/1996 |
| JP | 8-184965 | * | 7/1996 |

OTHER PUBLICATIONS

125:234433 CAPLUS abstract and JPO abstract JP 8–179508.*
125:261258 CAPLUS abstract and JPO abstract JP 8–184965.*
109:149272 CAPLUS abstract Eltamany, E.H. et al.*
84:17774 CAPLUS abstract Imai, Y. et al.*

* cited by examiner

Primary Examiner—Rosemary Ashton
(74) Attorney, Agent, or Firm—Peter F. Corless; Darryl P. Frickey; Edwards & Angell, LLP

(57) ABSTRACT

New photoacid generator compounds ("PAGs") are provided and photoresist compositions that comprise such compounds. In particular, non-ionic PAGs are provided that contain an oxime sulfonate group, and/or an N-oxyimidosulfonate group. PAGs of the invention are particularly useful as photoactive components of photoresists imaged at short wavelengths such as 248 nm, 193 nm and 157 nm.

14 Claims, No Drawings

OXIME SULFONATE AND N-OXYIMIDOSULFONATE PHOTOACID GENERATORS AND PHOTORESISTS COMPRISING SAME

BACKGROUND OF THE INVENTION

1. Field of the Invention

This invention relates to new photoacid generator compounds ("PAGs") and photoresist compositions that comprise such compounds. In particular, the invention relates to oxime sulfonate and N-oxyimidosulfonate photoacid generator compounds. PAGs of the invention are preferably employed in resists imaged at short wavelengths, such as sub-300 nm and sub-200 nm, e.g. 248 nm, 193 nm and 157 nm and ionizing radiation such as EUV, IPL, E-beam and X-ray.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

SUMMARY OF THE INVENTION

We have now discovered novel photoacid generator compounds (PAGs) for use in either positive-acting or negative-acting photoresist compositions. PAGs of the invention contain an oxime sulfonate group, and/or an N-oxyimidosulfonate group. PAGs of the invention are particularly useful as photoactive components of photoresists imaged at short wavelengths such as 248 nm, 193 nm and 157 nm or even higher energy exposures such as EUV, IPL, E-beam and X-ray.

We have found that excessive absorbance can remain an issue for resists imaged at short wavelengths such as 193 nm, even where the resist resin is optimized for low absorbance such as by having little or no aromatic content. In particular, we have found that a targeted absorption "budget" for a short wavelength resist may be substantially consumed by the resin component alone.

PAGs of the invention can exhibit good transparency especially at 193 nm. Accordingly, PAGs of the invention are particularly useful for photoresists imaged at short wavelengths such as 193 nm and 157 nm and can add minimal absorbance amounts to the formulated resist.

More particularly, in a first aspect of the invention, oxime sulfonate PAGs are provided wherein the oxime carbon has one or two electron-withdrawing substituents. Preferred oxime sulfonate PAGs of the invention include those of the following Formula I:

wherein at least one of R and R' is an electron-withdrawing moiety such as cyano; nitro; haloalkyl particularly fluoroalkyl such as —$CF_3$, —$CF_2CF_3$ and other perfluoroalkyl; alkanoyl; alkylsulfinyl; alkylsulfonyl; and the like;

if only one of R and R' is an electron-withdrawing moiety, then one of R and R' is suitably carbocyclic aryl such as optionally substituted phenyl and optionally substituted naphthyl; optionally substituted alkyl; optionally substituted alkenyl; optionally substituted alkynyl; optionally substituted alkoxy; optionally substituted heteroalicyclic or heteroaromatic suitably having 1–3 rings with 3–8 ring members per ring and 1–3 N, O or S atoms;

Y is a non-hydrogen substituent such as optionally substituted alkyl; optionally substituted alkenyl; optionally substituted alkynyl; optionally substituted alkoxy; optionally substituted alkylthio; optionally substituted alkylsulfinyl; optionally substituted carbocyclic aryl such as phenyl, naphthyl; and the like; or optionally substituted heteroalicyclic or heteroaromatic suitably having 1–3 rings with 3–8 ring members per ring and 1–3 N, O or S atoms, such as thienyl, and the like.

Preferably, R is an electron-withdrawing group and R' is a carbocyclic aryl or heteroalicyclic or heteroaromatic group. Cyano is a preferred R group. A particularly preferred R group is halo-alkyl such as $C_{1-16}$ haloalkyl, particularly fluoroalkyl such as $C_{1-16}$perfluoroalkyl e.g., such as trifluoromethyl, pentafluoroethyl, perfluorobutane and the like.

Preferred R' groups include optionally substituted naphthyl, optionally substituted thienyl and optionally substituted pentafluorophenyl.

R and R' may be the same, or more typically R and R' are different.

In Formula I, preferred Y groups may be electron-withdrawing groups (to provide a stronger photoacid) such as haloalkyl, particularly perhaloalkyl such as perfluoroalkyl e.g. $C_{1-12}$perfluoroalkyl; carbocyclic aryl such as phenyl, naphthyl and the like, particularly substituted with one or more electron-withdrawing substituents such as nitro, cyano, halo (especially fluoro) with pentafluorophenyl being particularly preferred. Electron-donating groups also will be suitable Y groups such as optionally substituted alkyl, although perhaps less preferred.

In a further aspect of the invention, N-oxyimidosulfonate PAGs are provided that preferably contain two or more N-oxyimidosulfonate groups in a single PAG compound. Such compounds are capable of generating a molar excess of photogenerated acid per mole of the PAG compound.

Bis-N-oxyimidosulfonate compounds are generally preferred, i.e. PAGs that contain two N-oxyimidosulfonate groups. Also preferred are N-oxyimidosulfonate compounds that do not contain an aromatic group. In particular, preferred are compounds of the following Formula IIA:

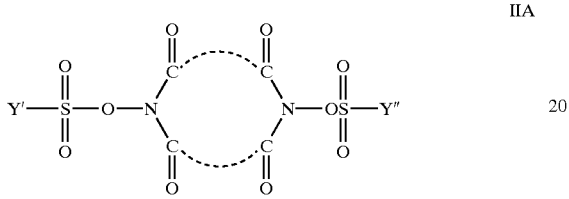

IIA wherein Y' and Y" are the same or different non-hydrogen substituent such as the groups specified for Y in Formula I above;

and the dotted lines indicate covalent linkage (to provide a single compound) between the two N-oxyimidosulfonate groups.

A variety of linkages between the N-oxyimidosulfonate groups are suitable. For example, the N-oxyimidosulfonate groups can each form 5, 6, 7, or 8-membered fused rings, such as PAGs of the following Formula IIB:

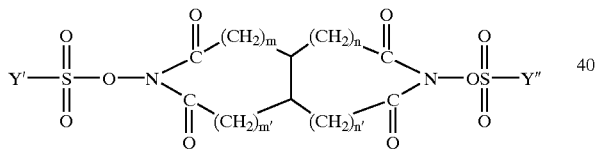

IIB wherein Y' and Y" are the same or different non-hydrogen substituent as defined in Formula I above;

m, m', n, and n' are each independently 0, 1 or 2, and the sum of each of m and m' and of n and n' does not exceed 3.

Generally preferred PAGs of Formula IIB include those where m, m', n, and n' are each zero, i.e. PAGs of the following Formula IIB':

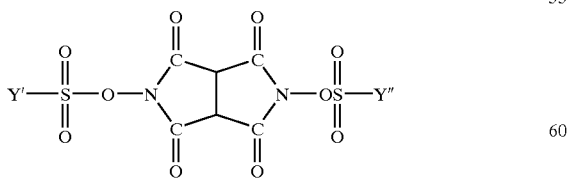

IIB' wherein Y' and Y" are the same or different non-hydrogen substituent as defined in Formula I above.

Additional preferred PAGs of Formula IIA include those where the two imidosulfonate groups each form a ring, and with a further ring interposed between the two imidosulfonate rings. For example, preferred PAGs include those of the following Formula IIC:

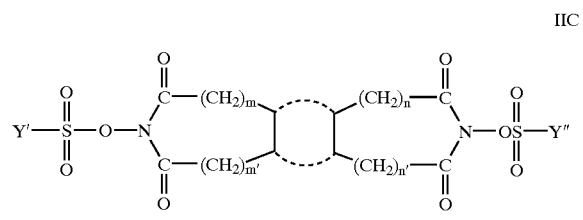

IIC wherein Y' and Y" are the same or different non-hydrogen such as those groups specified for Y in Formula I above; m, m, n, and n' are the same as defined in Formula IIB above; and the dotted lines designate an alicyclic, carbon aryl, heteroalicyclic, or heteroaromatic ring interposed between and fused to the two depicted imidosulfonate rings.

Preferred PAGs of Formula IIC include those where m, m', n, and n' are each zero, i.e. PAGs of the following Formula IIC':

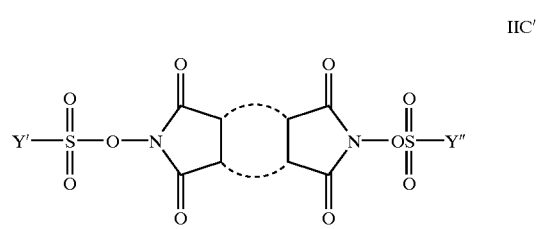

IIC' wherein Y' and Y" are the same as defined in Formula IIA above; and the dotted lines designate an alicyclic, carbon aryl, heteroalicyclic, or heteroaromatic ring interposed between and fused to the two depicted imidosulfonate rings.

Preferred interposed rings fused to imidosulfonate ring groups include cyclopentyl, cyclohexyl with an optional bridge group, and naphthyl, such as compounds of the following Formulae IICa, IICb and IICc:

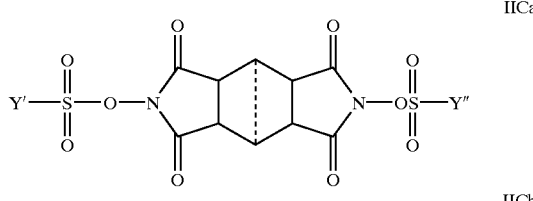

IICa

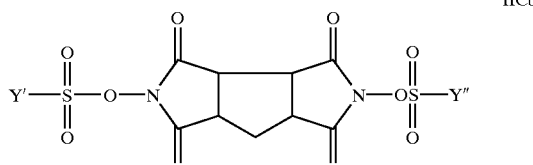

IICb

-continued

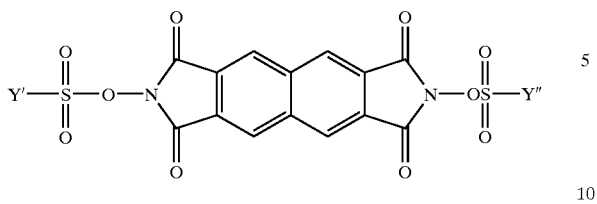

IICc wherein in each of Formulae IICa, IICb and IICc, Y' and Y" are the same as defined in Formula IIA; and the dotted line in Formula IICa designates an optional bridge group such as alkylene or alkenylene groups e.g. —CH$_2$—, —CH$_2$CH$_2$—, —CH$_2$CH$_2$CH$_2$—, —CH=CH—, —CH$_2$—CH=CH—, and the like.

In Formulae IIA, IIB, IIC, IICa, IICb and IICc, suitable Y' and Y" groups include electron-withdrawing groups (to provide a stronger photoacid) such as haloalkyl, particularly perhaloalkyl such as perfluoroalkyl e.g. C$_{1-16}$perfluoroalkyl such as trifluoromethyl, pentafluoroethyl, perfluorobutyl, perfluoroctane, and the like; carbocyclic aryl such as phenyl, naphthyl and the like, particularly substituted with one or more electro-withdrawing substituents such as nitro, cyano, halo (especially fluoro) with pentafluorophenyl being preferred; heteroaromatic particularly optionally substituted thienyl; and alicyclic and heteroalicyclic groups. In Formulae IIA, IIB, IIC, IICa, IICb and IICc. electron-donating groups also will be suitable Y' and Y" groups such as alkyl including C$_{1-10}$ alkyl; and the like.

Preferably, PAGs of the invention are used in positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon or a tertiary alicyclic carbon covalently linked to the carboxyl oxygen of the ester are generally preferred photoacid-labile groups of resins employed in photoresists of the invention.

As discussed above, preferred imaging wavelengths of photoresists of the invention include sub-300 nm wavelengths e.g. 248 nm, and sub-200 nm wavelengths e.g. 193 nm and 157 nm, and higher energy radiation such as radiation having a wavelength of less than 100 nm, and otherwise high energy radiation such as EUV, electron beam, ion beam or X-ray.

Particularly preferred photoresists of the invention contain an imaging-effective amount of one or more oxime sulfonate and/or N-oxyimidosulfonate PAGs as disclosed herein and a resin that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate (which includes (meth)acrylates) units can undergo a deblocking reaction in the presence of photoacid. Exemplary alkyl acrylates (which includes (meth) acrylates) that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates (which includes (meth)acrylates) that can undergo a photoacid-induced reaction; such polymers have been described in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate (which includes (meth)acrylates) such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups, such as polymers as described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624 and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083 ; European Published Applications EP01008913A1 and EP00930542A1; and U.S. pending patent application Ser. No. 09/143,462, filed Aug. 28, 1998, now U.S. Pat. No. 6,136,501 all incorporated herein by reference; and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference; and/or combinations of one or more resins of types i), ii) or iii), i.e. combinations of one or more of polymers that polymerized units of a non-aromatic cyclic olefin, polymers that contain alkyl acrylates (which includes (meth)acrylates); and/or polymers that contain polymerized anhydride units.

Resists of the invention also may comprise. a mixture of distinct PAGs, typically a mixture of 2 or 3 different PAGs, more typically a mixture that consists of a total of 2 distinct PAGs. At least one PAG of the mixture will be an oxime sulfonate and/or N-oxyimidosulfonate PAGs compound of the invention, preferably a PAG compound of Formulae I, IIA, IIB, IIB', IIC, IIC', IICa, IICb, or IICc. The other PAG(s) of the mixture also may be an oxime sulfonate and/or N-oxyimidosulfonate PAGs compound of the invention PAG, or may be another type of PAG, including an onium compound such as an iodonium or sulfonium compound, or other non-ionic compound, preferably without any aromatic content such as an imidosulfonate PAG compound, a disulfone PAG, and the like. Photoresists that contain such PAG mixtures can exhibit even further enhanced lithographic performance.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions.

The invention further provides articles of manufacture comprising substrates such as a microelectronic wafer or a flat panel display substrate having coated thereon the photoresists and relief images of the invention. Other aspects of the invention are disclosed infra.

DETAILED DESCRIPTION OF THE INVENTION

As discussed above, the invention provides PAGs that contain an oxime sulfonate group, and/or an N-oxyimidosulfonate group, including PAGs of Formulae I, IIA, IIB, IIC, IICa, IICb and IICc.

As stated above, various substituent groups of PAGs of the invention may be optionally substituted. Substituted moieties (including substituted R, R', Y, Y' and Y" groups of Formulae I, IIA, IIB, IIC, IICa, IICb and IICc) are suitably substituted at one or more available positions by, e.g., halogen such as F, Cl Br and/or I, nitro, cyano, sulfono, alkyl including $C_{1-16}$ alkyl with $C_{1-8}$ alkyl being preferred, haloalkyl such as fluoroalkyl (e.g. trifluoromethyl) and perhaloalkyl such as perfluoro$C_{1-4}$alkyl, alkoxy including $C_{1-16}$ alkoxy having one or more oxygen linkages with $C_{1-8}$ alkoxy being preferred, alkenyl including $C_{2-12}$ alkenyl with $C_{2-8}$ alkenyl being preferred, alkenyl including $C_{2-12}$ alkenyl with $C_{2-8}$ alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl, anthracenyl and naphthyl.

As used herein, the term alkyl, alkenyl and alkynyl unless otherwise modified refers to both cyclic and noncyclic groups, although of course cyclic groups will comprise at least three carbon ring members. Alkenyl and alkynyl groups of compounds of the invention have one or more unsaturated linkages, typically 1 to about 3 or 4 unsaturated linkages. Also, the terms alkenyl and alkynyl as used herein refer to both cyclic and noncyclic groups, although straight or branched noncyclic groups are generally more preferred. Alkoxy groups of PAG compounds of the invention have one or more oxygen linkages, typically 1 to about 5 or 6 oxygen linkages. Alkylthio groups of PAGs of the invention have one or more thioether linkages, typically 1 to about 5 or 6 thioether linkages. Alkylsulfinyl groups of PAG compounds of the invention have one or more sulfinyl (SO) linkages, typically 1 to about 5 or 6 sulfinyl linkages. Alkylsulfonyl groups of PAG compounds of the invention have one or more sulfonyl ($SO_2$) linkages, typically 1 to about 5 or 6 sulfonyl linkages. Preferred alkylamino groups of PAG compounds of the invention include those groups having one or more primary, secondary and/or tertiary amine groups, preferably 1 to about 3 or 4 amine groups. Suitable alkanoyl groups have one or more carbonyl groups, typically 1 to about 4 or 5 carbonyl groups. Alkoxy, alkylthio, alkylsulfinyl, alkylsulfonyl, alkanoyl and other groups may be suitably either linear or branched. Carbocyclic aryl as used herein refers to non-hetero aromatic groups that have 1 to 3 separate or fused rings and 6 to about 18 carbon ring members and may include e.g. phenyl, naphthyl, biphenyl, acenaphthyl, phenanthracyl, and the like. Phenyl and naphthyl are often preferred. Suitable heteroaromatic or heteroaryl groups will have 1 to 3 rings, 3 to 8 ring members in each ring and from 1 to about 3 hetero atoms (N, O or S).

Specifically suitable heteroaromatic or heteroaryl groups include e.g. courmarinyl, quinolinyl, pyridyl, pyrazinyl, pyrimdinyl, furyl, pyrrolyl, thienyl, thiazolyl, oxazolyl, imidazolyl, indolyl, benzofuranyl, and benzothiazole.

PAGs of the invention can be readily prepared. For instance, oxime sulfonate PAGs of the invention can be prepared by reaction of an α-cyano compound of the formula $NCCH_2$—R where R is as defined in Formula I above with amyl nitrate to provide the corresponding oxime of the formula NCCH(=NOH)R. That oxime can be reacted with a substituted sulfonyl chloride (e.g. substituted with a group Y as defined in Formula I above) to provide PAGs of Formula I. N-oxyimidosulfonate PAGs of the invention can be suitably prepared e.g. by reaction of a corresponding anhydride such as a bis-succinic anhydride with hydroxylamine to provide the corresponding N-hydroxy imide. That N-hydroxy imide then can be reacted with a substituted sulfonyl chloride (e.g. substituted with a group Y' as defined in Formula IIA above).

As discussed above, PAGs of the invention are useful as the radiation sensitive component in photoresist compositions, including both positive-acting and negative-acting chemically amplified resist compositions.

The photoresists of the invention typically comprise a resin binder and a photoactive component of the invention as described above. Preferably the resin binder has functional groups that impart alkaline aqueous developability to the resist composition. For example, preferred are resin binders that comprise polar functional groups such as hydroxyl or carboxylate. Preferably the resin binder is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Additional suitable resins include those formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

Preferably, a photoacid generator compound of the invention is employed in a chemically amplified positive-acting resist. A number of such resist compositions have been described, e.g., in U.S. Pat. Nos. 4,968,581; 4,883,740; 4,810,613 and 4,491,628 and Canadian Patent Application 2.001,384, all of which are incorporated herein by reference for their teaching of making and using chemically amplified positive-acting resists. In accordance with the present invention, those prior resist compositions are modified by substitution of the photoactive component of the invention as the radiation sensitive component.

For imaging at wavelengths greater than 200 nm, such as 248 nm, a particularly preferred chemically amplified photoresist of the invention comprises in admixture a photoactive component of the invention and a resin binder that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

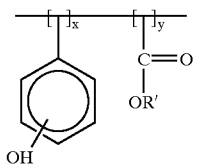

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Another preferred resin binder for a positive chemically amplified resist of the invention has phenolic and nonaromatic cyclic alcohol units, wherein at least of portion of the hydroxyl groups of the copolymer are bonded to acid labile groups. Preferred acid labile moieties are acetate groups including t-butyl acetate groups of the formula $(CH_3)_3COC(O)CH_2$—; oxycarbonyl groups such as t-butyl oxycarbonyl (t-Boc) groups of the formula $(CH_3)_3CC(O)O$—; and acetal and ketals. Chemically amplified positive-acting photoresists containing such a copolymer have been disclosed in U.S. Pat. No. 5,258,257 to Sinta et al.

Other preferred resins that have acid-labile deblocking groups for use in a positive-acting chemically-amplified photoresist of the invention have been disclosed in European Patent Application 0829766A2 of the Shirley Company (resins with acetal and ketal resins) and European Patent Application EP0783136A2 of the Shirley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

PAGs of the invention (which includes PAGs of Formulae I, IIA, IIB, IIC, IICa, IICb and IICc as defined above) also are preferably used with polymers that contain one or more photoacid-labile groups and that are substantially, essentially or completely free of phenyl or other aromatic groups. Such photoresist compositions are particularly useful for imaging with sub-200 nm radiation such as 193 nm radiation.

For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 of the Shirley Company.

Suitable polymers that are substantially or completely free of aromatic groups suitably contain acrylate units such as photoacid-labile acrylate units as may be provided by polymerization of methyladamantylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetrabutylammonium hydroxide (TBAH), or more particularly the lactate salt of tetrabutylammonium hydroxide, which can enhance resolution of a developed resist relief image. The added base is suitably used in relatively small amounts, e.g. about 1 to 10 percent by weight relative to the PAG, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that a PAG of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Printed circuit board substrates such as copper clad laminates are also particularly preferred. The photoresists of the invention will be particularly useful for circuit board imaging, including through hole and other aperture plating. Typical printed circuit board substrates have one or more copper layers interleaved with resin layers, such as epoxy layers.

Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm, and sub-200 nm such as 193 nm and 157 nm. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLE 1

A PAG of the invention of the structure NC(1-naphthyl)C=NOS(O)$_2$C$_6$F$_5$ can be prepared by reaction NCCH$_2$—(1-naphthyl) with amyl nitrate to provide the oxime NCCH(=NOH) (1-naphthyl). That oxime is reacted with pentafluorobenzenesulfonyl chloride to provide NC(1-naphthyl)C=NOS(O)$_2$C$_6$F$_5$.

EXAMPLE 2

Photoresist Preparation and Lithographic Processing

A photoresist of the invention is prepared by mixing the following components with amounts expressed as weight percent based on total weight of the resist compositions:

| Resist components | Amount (wt.%) |
|---|---|
| Resin binder | 15 |
| Photoacid generator | 4 |
| Ethyl lactate | 81 |

The resin binder is a terpolymer consisting of polymerized 60 mole percent vinylphenol units, 20 mole percent styrene units and 20 mole percent t-butylacrylate. The photoacid generator was the compound of Example 1 above. Those resin and PAG components are admixed in the ethyl lactate solvent.

The formulated resist composition is spin coated onto HMDS vapor primed 4 inch silicon wafers and softbaked via a vacuum hotplate at 90° C. for 60 seconds. The resist coating layer is exposed through a photomask at 248 nm, and then the exposed coating layers are post-exposure baked at 110° C. The coated wafers are then treated with 0.26N aqueous tetrabutylammonium hydroxide solution to develop the imaged resist layer and provide a relief image.

The foregoing description of the invention is merely illustrative thereof, and it is understood that variations and modifications can be effected without departing from the spirit or scope of the invention as set forth in the following claims.

What is claimed is:

1. A photoresist composition comprising a resin and a photoacid generator wherein the photoacid generator compound is of the following Formula IIB:

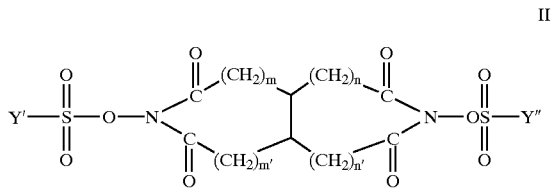

IIB wherein Y' and Y" are each the same or different non-hydrogen substituent; m, m', n, and n' are each independently 0, 1 or 2, and the sum of each of m and m' and of n and n' does not exceed 3.

2. A photoresist composition comprising a resin and a photoacid generator wherein the photoacid generator compound is of the following Formula IIB':

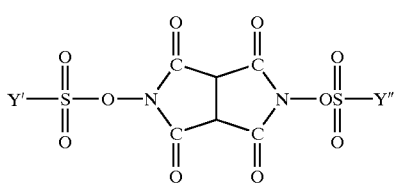

IIB' wherein Y' and Y" are each the same or different non-hydrogen substituent.

3. A photoresist composition comprising a resin and a photoacid generator wherein the photoacid generator compound is of the following Formulae IICa or IICc:

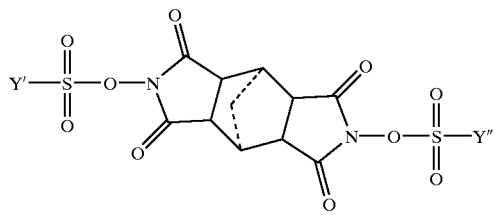

IICa

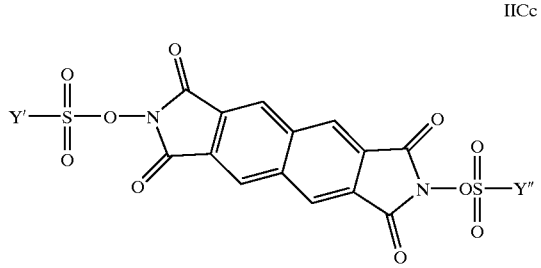

IICc wherein Y' and Y" in each of Formulae IICa and IICc are the same or different non-hydrogen substitutent.

4. The photoresist of any one of claim 1, 2 or 3 wherein one or both of Y' and Y" is optionally substituted alkyl; optionally substituted alkenyl; optionally substituted alkynyl; optionally substituted alkoxy; optionally substituted alkylthio; optionally substituted alkylsulfinyl; optionally substituted carbocyclic aryl; or optionally substituted heteroalicyclic or optionally substituted heteroaromatic.

5. The photoresist of any one of claim 1, 2 or 3 wherein one or both of Y' and Y" is perfluoroalkyl, pentafluorophenyl, optionally substituted naphthyl or optionally substituted thienyl.

6. The photoresist composition of any one of claim 1, 2 or 3 wherein the composition is a chemically-amplified positive-acting photoresist.

7. The photoresist composition of any one of claim 1, 2 or 3 wherein the composition is a negative-acting photoresist.

8. An article of manufacture having on at least one surface a coating layer of the photoresist composition of any one of claims 1, 2 and 3.

9. The article of claim 8 wherein the photoresist composition is coated on a microelectronic wafer substrate, flat panel display substrate or a printed circuit board substrate.

10. A photoacid generator compound of the following Formula IIB:

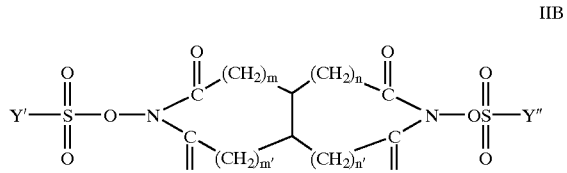

IIB wherein Y' and Y" are each the same or different non-hydrogen substituent; m, m', n, and n' are each independently 0, 1 or 2, and the sum of each of m and m' and of n and n' does not exceed 3.

11. A photoacid generator compound of the following Formula IIB':

IIB'

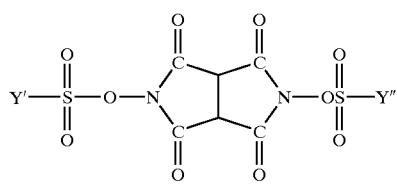

wherein Y' and Y" are each the same or different non-hydrogen substituent.

12. A photoacid generator compound of the following Formulae IICa or IICc:

IICa

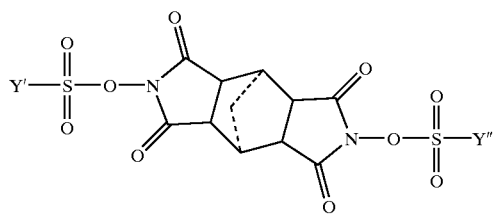

IICc

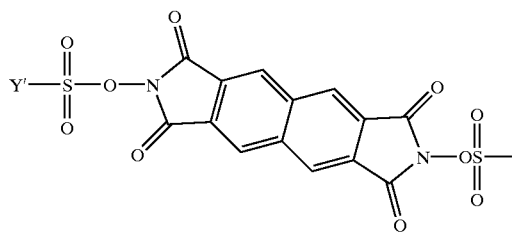

wherein Y' and Y" in each of Formulae IICa and IICc are the same or different non-hydrogen substituent.

13. A photoresist composition comprising:

a resin comprising polymerized norbornene groups;

as a separate component than the resin, a photoacid generator compound of the following formula:

RR'C=NOS(O)$_2$Y wherein at least one of R and R' is nitro, haloalkyl, perfluoroalkyl, alkanoyl, alkylsulfinyl, or alkylsulfonyl;

if only one of R and R' is nitro, haloakyl, perfluoroalkyl, alkanoyl, alkylsulfinyl, or alkylsulfonyl, then one or R and R' is optionally substituted carbocyclic aryl; optionally substituted alkyl; optionally substituted alkenyl; optionally substituted alkynyl; optionally substituted alkoxy; optionally substituted heteroalicyclic or optionally substituted heteroaromatic; and Y is a non-hydrogen substituent.

14. The photoresist of claim 13 wherein the photoresist is a chemically-amplified positive-acting resist.

* * * * *